United States Patent
Jo et al.

(10) Patent No.: US 12,048,197 B2
(45) Date of Patent: Jul. 23, 2024

(54) DISPLAY DEVICE AND MANUFACTURING METHOD THEREOF

(71) Applicant: Samsung Display Co., LTD., Yongin-si (KR)

(72) Inventors: Jung Yun Jo, Yongin-si (KR); Ji Hye Han, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 18/501,590

(22) Filed: Nov. 3, 2023

(65) Prior Publication Data
US 2024/0065030 A1 Feb. 22, 2024

Related U.S. Application Data

(62) Division of application No. 17/349,530, filed on Jun. 16, 2021, now Pat. No. 11,849,606.

(30) Foreign Application Priority Data

Jul. 8, 2020 (KR) .................. 10-2020-0084308

(51) Int. Cl.
*H10K 59/121* (2023.01)
*H10K 71/00* (2023.01)

(52) U.S. Cl.
CPC .......... *H10K 59/121* (2023.02); *H10K 71/00* (2023.02)

(58) Field of Classification Search
CPC .... H10K 59/121; H10K 71/00; H10K 71/231; H10K 59/122; H10K 71/211; H10K 71/166; H01L 27/1262
See application file for complete search history.

(56) References Cited

U.S. PATENT DOCUMENTS

| | | | | |
|---|---|---|---|---|
| 6,127,089 A | * | 10/2000 | Subramanian .... | H01L 21/76807 430/312 |
| 6,127,258 A | * | 10/2000 | Watanabe ......... | H01L 21/76835 438/785 |
| 6,333,258 B1 | * | 12/2001 | Miyata .............. | H01L 21/31116 257/E21.252 |
| 6,451,688 B1 | * | 9/2002 | Shimpuku ......... | H01L 21/76813 438/638 |
| 6,809,028 B2 | * | 10/2004 | Chen ................. | H01L 21/76807 257/E21.579 |

(Continued)

FOREIGN PATENT DOCUMENTS

| JP | 9-199728 | 7/1997 |
|---|---|---|
| KR | 10-2017-0078394 | 7/2017 |

OTHER PUBLICATIONS

J.M. Jaramillo et al., "Wet etching of hydrogenated amorphous carbon films", Diamond and Related Materials, 2001, pp. 976-979, vol. 10.

(Continued)

*Primary Examiner* — Caleb E Henry
(74) *Attorney, Agent, or Firm* — KILE PARK REED & HOUTTEMAN PLLC

(57) ABSTRACT

A display device includes a substrate including pixels; a buffer layer disposed on the substrate; an etch stopper layer disposed between the substrate and the buffer layer; and at least one penetrating-hole penetrating the substrate, the buffer layer, and the etch stopper layer, wherein the etch stopper layer includes amorphous carbon.

9 Claims, 14 Drawing Sheets

(56) References Cited

U.S. PATENT DOCUMENTS

| | | | | |
|---|---|---|---|---|
| 6,815,341 B2* | 11/2004 | Yuasa | | H01L 21/3165 |
| | | | | 257/E21.256 |
| 7,057,289 B2* | 6/2006 | Farrar | | H01L 21/76835 |
| | | | | 257/774 |
| 7,061,015 B2* | 6/2006 | Kim | | H01L 21/76804 |
| | | | | 438/30 |
| 8,934,228 B2 | 1/2015 | Franklin et al. | | |
| 9,373,538 B2* | 6/2016 | Greco | | H01L 21/76813 |
| 2003/0116854 A1* | 6/2003 | Ito | | H01L 21/76855 |
| | | | | 257/761 |
| 2004/0180531 A1* | 9/2004 | Horikoshi | | H10N 50/01 |
| | | | | 257/E27.005 |
| 2009/0093128 A1* | 4/2009 | Seamons | | H01L 21/3146 |
| | | | | 257/E21.492 |
| 2017/0110532 A1* | 4/2017 | Kim | | H10K 59/12 |
| 2017/0148856 A1* | 5/2017 | Choi | | H10K 59/873 |
| 2017/0162637 A1* | 6/2017 | Choi | | G09G 3/3225 |
| 2018/0026138 A1 | 1/2018 | Yamaguchi et al. | | |
| 2018/0151834 A1* | 5/2018 | Kanaya | | H10K 77/111 |
| 2018/0159075 A1* | 6/2018 | Kim | | H01L 29/7869 |
| 2019/0207132 A1* | 7/2019 | Park | | H10K 50/852 |
| 2019/0334120 A1* | 10/2019 | Seo | | H10K 59/121 |
| 2020/0020752 A1* | 1/2020 | Shi | | H10K 50/844 |
| 2020/0064968 A1* | 2/2020 | Kim | | G06F 3/0416 |
| 2020/0075692 A1* | 3/2020 | Park | | H10K 50/844 |
| 2020/0106046 A1* | 4/2020 | Kim | | H10K 59/12 |
| 2020/0106057 A1* | 4/2020 | Yoo | | H10K 59/121 |
| 2020/0152842 A1* | 5/2020 | Park | | G06F 1/1637 |
| 2020/0168683 A1* | 5/2020 | Son | | H10K 77/10 |
| 2020/0176520 A1* | 6/2020 | Kim | | H10K 50/844 |
| 2020/0176708 A1* | 6/2020 | Kanaya | | H10K 59/87 |
| 2020/0194714 A1* | 6/2020 | Won | | H10K 50/84 |
| 2020/0194721 A1* | 6/2020 | Lee | | H10K 59/40 |
| 2020/0212140 A1* | 7/2020 | Huh | | H01L 25/0753 |
| 2021/0020712 A1* | 1/2021 | Zhang | | H10K 59/875 |
| 2021/0070717 A1* | 3/2021 | Li | | H10K 85/322 |
| 2021/0135164 A1* | 5/2021 | Yu | | H10K 71/311 |
| 2021/0143365 A1* | 5/2021 | Jo | | H10K 59/122 |

OTHER PUBLICATIONS

Sriram Vishwanathan, "Plasma Enhanced Chemical Vapor Deposition of Diamondlike Carbon Films Using Acetylene", A Thesis Submitted to the Faculty of New Jersey Institute of Technology, Aug. 1998.

* cited by examiner

DISPLAY DEVICE AND MANUFACTURING METHOD THEREOF

CROSS-REFERENCE TO RELATED APPLICATION(S)

This is a divisional application of U.S. patent application Ser. No. 17/349,530 filed Jun. 16, 2021 (now pending), the disclosure of which is incorporated herein by reference in its entirety. U.S. patent application Ser. No. 17/349,530 claims priority to and benefits of Korean patent application 10-2020-0084308 under 35 U.S.C. § 119, filed Jul. 8, 2020, in the Korean Intellectual Property Office, the entire contents of which are incorporated herein by reference.

BACKGROUND

1. Technical Field

The disclosure generally relates to a display device and a manufacturing method thereof, and, to a display device including an etch stopper layer including amorphous carbon and a manufacturing method of the display device.

2. Description of the Related Art

Recently, research has been actively conducted on a display device in which penetrating-holes are formed in at least a portion of a panel.

A display device having a penetrating-hole formed therein may be provided by performing a predetermined etching process after an etch stopper layer is deposited.

However, according to a conventional process associated with the etch stopper layer, process costs have increased since additional processes were required, and the efficiency of the performance of the predetermined etching process was low.

Accordingly, demands for a display device having reduced process cost and improved efficiency of processes have increased.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

Embodiments provide a display device and a manufacturing method thereof, which can have a simplified manufacturing process and improved process efficiency.

In accordance with an aspect of the disclosure, there is provided a display device that may include a substrate including pixels; a buffer layer disposed on the substrate; an etch stopper layer disposed between the substrate and the buffer layer; and at least one penetrating-hole penetrating the substrate, the buffer layer, and the etch stopper layer, wherein the etch stopper layer may include amorphous carbon.

The at least one penetrating-hole may include a first hole penetrating the substrate; a second hole penetrating the buffer layer; and a third hole penetrating the etch stopper layer.

The pixels may include a light emitting element that may emit light in response to an electrical signal provided to the light emitting element.

The first hole, the second hole, and the third hole of the at least one penetrating-hole may form a single cavity.

The first hole, the second hole, and the third hole of the at least one penetrating-hole may not overlap an area where the light emitting element may be disposed in a plan view.

The display device may further include a semiconductor layer disposed on the buffer layer; and a conductive pattern including at least a portion disposed on the etch stopper layer. The semiconductor layer may at least partially overlap the conductive pattern.

The display device may further include a stress compensation layer disposed between the etch stopper layer and the buffer layer.

The etch stopper layer may be formed through a chemical vapor deposition process.

The light emitting element may be one of an organic light emitting diode, an inorganic light emitting diode, and a light emitting diode made of an organic material and an inorganic material.

In accordance with an aspect of the disclosure, there is provided a method of manufacturing a display device, the method may include irradiating a laser light onto a substrate to form a hole line in the substrate; forming an etch stopper layer on the substrate to overlap the hole line, wherein the etch stopper layer may include amorphous carbon; forming a buffer layer on the etch stopper layer; etching the substrate to form a first hole corresponding to the hole line; forming a second hole corresponding to the first hole in the etch stopper layer; forming a third hole corresponding to the second hole in the buffer layer; and disposing a display element layer including a light emitting element that may emit light in response to an electrical signal provided to the light emitting element.

The forming of the first hole, the second hole, and the third hole may include forming the first hole, the second hole, and the third hole as a single cavity.

The etching of the substrate may include forming the first hole through a wet etching process.

The forming of the second hole may include removing the etch stopper layer corresponding to the second hole through an $O_2$ ashing process.

The forming of the second hole and the forming of the third hole may be performed in a single process.

The forming of the etch stopper layer and the forming of the buffer layer may be continuously performed.

The forming of the hole line may include forming the hole line in a thickness direction of the substrate.

The method may further include forming a conductive pattern on the etch stopper layer between the forming of the etch stopper layer and the forming of the buffer layer.

The method may further include forming a stress compensation layer on the etch stopper layer between the forming of the conductive pattern on the etch stopper layer and the forming of the buffer layer.

BRIEF DESCRIPTION OF THE DRAWINGS

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the embodiments to those skilled in the art.

In the drawing figures, dimensions may be exaggerated for clarity of illustration. It will be understood that when an element is referred to as being "between" two elements, it can be the only element between the two elements, or one or more intervening elements may also be present. Like reference numerals refer to like elements throughout. In the drawings.

DETAILED DESCRIPTION OF THE EMBODIMENTS

Figure 1:
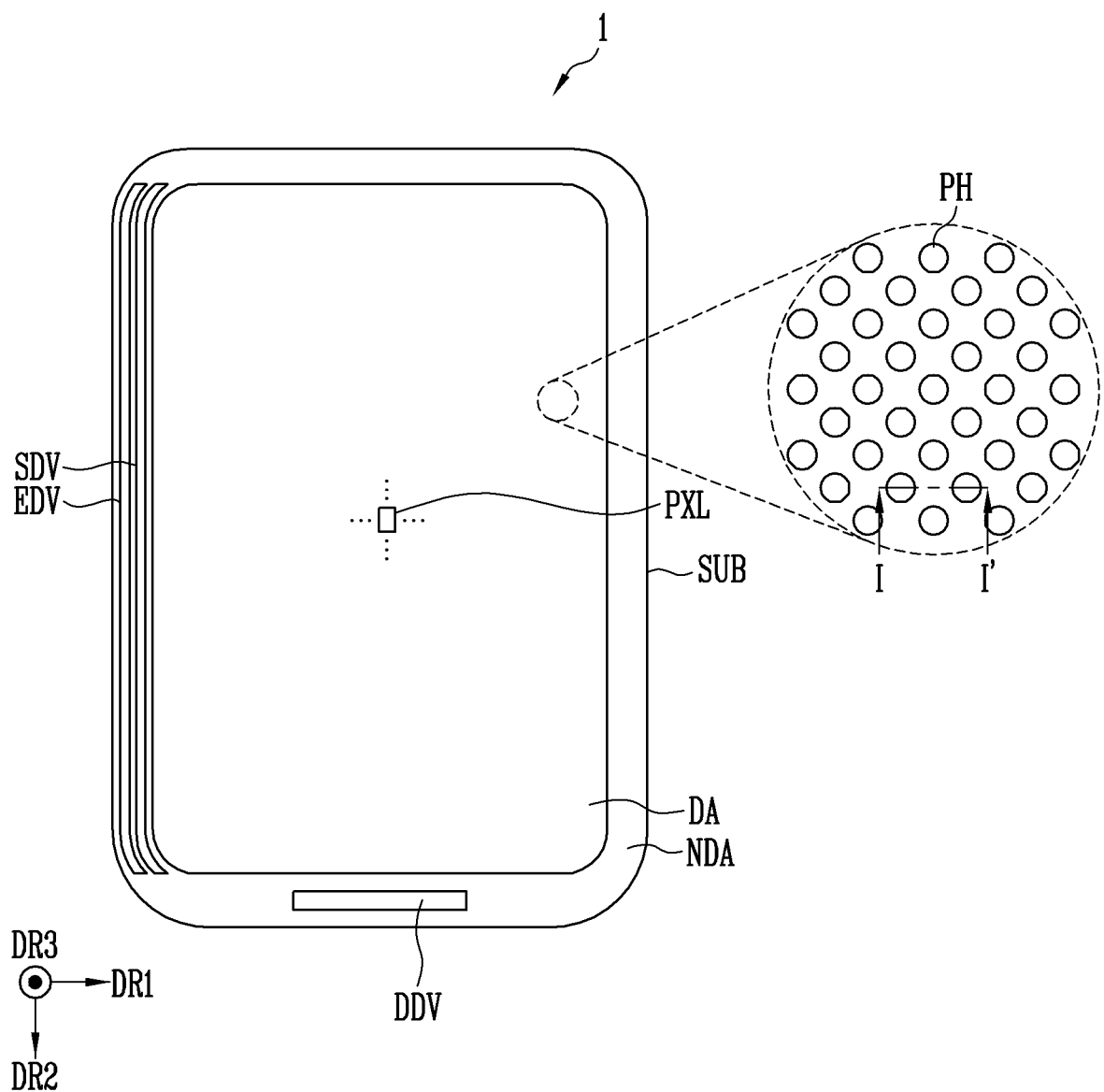
FIG. 1 is a diagram illustrating a display device in accordance with an embodiment.

Embodiments disclosed in the specification are provided only for illustrative purposes and for full understanding of the scope of the disclosure by those skilled in the art. However, the disclosure is not limited to the embodiments, and it should be understood that the disclosure includes modification examples or change examples without departing from the spirit and scope of the disclosure.

The terms used in the specification have been selected as general terms currently widely used if possible considering the functions in the disclosure, but they may depend on the intentions of those skilled in the art, practice, the appearance of new technologies, etc. In addition, specific cases use the terms selected arbitrarily by the applicant and in these cases, their meaning will be described when describing corresponding disclosures. Thus, it should be noted that the terms used in the specification should be construed on the basis of their actual meanings and contents through the specification, not just names thereof.

The drawings attached to the specification are provided to explain the disclosure, and the shapes shown in the drawings may be exaggerated and displayed as necessary to help understanding of the disclosure, and thus the disclosure is not limited to the drawings.

In the specification, when it is determined that a detailed description of a known configuration or function related to the disclosure may obscure the gist of the disclosure, a detailed description thereof will be omitted as necessary.

The terms "and" and "or" may be used in the conjunctive or disjunctive sense and may be understood to be equivalent to "and/or." In the specification and the claims, the phrase "at least one of" is intended to include the meaning of "at least one selected from the group of" for the purpose of its meaning and interpretation. For example, "at least one of A and B" may be understood to mean "A, B, or A and B.

As used herein, the singular forms "a", "an" and "the" are intended to include the plural forms as well, unless the context clearly indicates otherwise.

It will be further understood that the terms "comprises" and/or "comprising," "includes" and/or "including", "have" and/or "having" and their variations when used in this specification, specify the presence of stated features, integers, steps, operations, elements, and/or components, but do not preclude the presence or addition of one or more other features, integers, steps, operations, elements, components, and/or groups thereof.

It will also be understood that when a layer is referred to as being "on" another layer or substrate, it can be directly on the other layer or substrate, or intervening layers may also be present. In contrast, when an element is referred to as being "directly on" another element, there are no intervening elements present.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the disclosure.

Also, "under", "below", "above', "upper", and the like are used for explaining relation association of components illustrated in the drawings. The terms may be a relative concept and described based on directions expressed in the drawings.

It will be understood that when a layer, region, or element is referred to as being "connected," the layer, the region, or the element may be directly connected or may be indirectly connected with intervening layers, regions, or elements therebetween. For example, when a layer, a region, or an element is electrically connected, the layer, the region, or the element may be directly electrically connected and/or may be indirectly electrically connected with intervening layers, regions, or elements therebetween.

The spatially relative terms "below", "beneath", "lower", "above", "upper", or the like, may be used herein for ease of description to describe the relations between one element or component and another element or component as illustrated in the drawings. It will be understood that the spatially relative terms are intended to encompass different orientations of the device in use or operation, in addition to the orientation depicted in the drawings. For example, in the case where a device illustrated in the drawing is turned over, the device positioned "below" or "beneath" another device may be placed "above" another device. Accordingly, the illustrative term "below" may include both the lower and upper positions. The device may also be oriented in other directions and thus the spatially relative terms may be interpreted differently depending on the orientations.

Additionally, the terms "overlap" or "overlapped" mean that a first object may be above or below or to a side of a second object, and vice versa. Additionally, the term "overlap" may include layer, stack, face or facing, extending over, covering or partly covering or any other suitable term as would be appreciated and understood by those of ordinary skill in the art. The terms "face" and "facing" mean that a first element may directly or indirectly oppose a second element. In a case in which a third element intervenes between the first and second element, the first and second element may be understood as being indirectly opposed to one another, although still facing each other. When an element is described as 'not overlapping' or 'to not overlap' another element, this may include that the elements are spaced apart from each other, offset from each other, or set aside from each other or any other suitable term as would be appreciated and understood by those of ordinary skill in the art.

The phrase "in a plan view" means viewing the object from the top, and the phrase "in a schematic cross-sectional view" means viewing a cross-section of which the object is vertically cut from the side.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

Unless otherwise defined, all terms (including technical and scientific terms) used herein have the same meaning as generally understood by those skilled in the art. Terms as defined in a commonly used dictionary should be construed as having the same meaning as in an associated technical context, and unless defined apparently in the description, the terms are not ideally or excessively construed as having formal meaning.

The disclosure generally relates to a display device and a manufacturing method thereof, and, to a display device including an etch stopper layer including amorphous carbon and a manufacturing method of the display device.

Hereinafter, a display device and a manufacturing method thereof in accordance with embodiments will be described with reference to FIGS. 1 to 14.

FIG. 1 is a diagram illustrating a display device in accordance with an embodiment.

The display device 1 may be a device that may provide visual data to a user. In accordance with an embodiment, the display device 1 may be a smartphone, a tablet personal computer (PC), a large screen device, a mobile phone, a video phone, an electronic book reader, a desktop PC, a laptop PC, a netbook computer, a workstation, a server, a personal digital assistant (PDA), a portable multimedia player (PMP), an MP3 player, a medical device, a camera, or a wearable device, but the disclosure is not limited to a specific embodiment or to the above listed types of devices.

Referring to FIG. 1, the display device 1 may include a substrate SUB, a pixel PXL, a driving unit, a line unit (not shown), and a penetrating-hole PH. The driving unit may include a scan driver SDV, an emission driver EDV, and a data driver DDV.

The substrate may include a display area DA and a non-display area NDA. The non-display area NDA may surround or may be adjacent to the display area DA.

The pixel PXL may be located or disposed on the substrate SUB. The pixel PXL may be located or disposed in the display area DA. Light may be emitted in a third direction DR3 in the display area DA. The pixel PXL may be provided in plurality to be arranged or disposed in a matrix form defined by rows extending along a first direction DR1 and columns extending along a second direction DR2.

The pixel PXL may include a light emitting element (see ID' shown in FIG. 2) which may emit light when an electrical signal may be applied thereto.

At least one of the scan driver SDV, the emission driver EDV, and the data driver DDV may be located or disposed together with the line unit in the non-display area NDA.

The substrate SUB may include a rigid material or a flexible material according to a purpose of the display device 1. However, the material of the substrate SUB, which may be applied to an embodiment, is not limited to a specific example.

The drivers SDV, EDV, and DDV may be located or disposed in the non-display area NDA in a plan view. The drivers SDV, EDV, and DDV may output electrical information provided to the pixel PXL. In a case that the electrical information is provided to the pixel PXL, a light emitting element LD included in the pixel PXL may emit light.

The scan driver SDV may provide a scan signal to the pixel PXL through a scan line.

The emission driver EDV may provide an emission control signal to the pixel PXL through an emission control line.

The data driver DDV may provide a data signal to the pixel PXL through a data line.

The line unit may be located or disposed in the non-display area NDA in a plan view. The line unit may electrically connect the driving unit and the pixel PXL.

The display device 1 may include penetrating-holes PH. The penetrating-holes PH may penetrate the display device 1 in the third direction DR3. The penetrating-hole PH may include a cavity or aperture therein. Although the penetrating-hole PH is illustrated in FIG. 1 as having a substantially circular shape in the third direction DR3, the shape of the penetrating-hole PH is not limited thereto.

The penetrating-hole PH may enable a physical signal generated from an internal configuration of the display device 1 to be easily transferred to the outside. In accordance with an embodiment, in a case that a sound device that may output a sound may be located or disposed at a rear surface of the display device 1, a vibration, a sound wave, and/or a sound, which may be provided from the sound device, may be efficiently output to the outside.

The penetrating-hole PH may be located or disposed in one or an area of the display device 1. The penetrating-hole PH may be disposed in the display area DA in a plan view. However, the disclosure is not necessarily limited thereto, and the penetrating-hole PH may be disposed in the non-display area NDA. The penetrating-hole PH will be described in detail later with reference to FIG. 3, and therefore, overlapping descriptions may be omitted.

Figure 2:
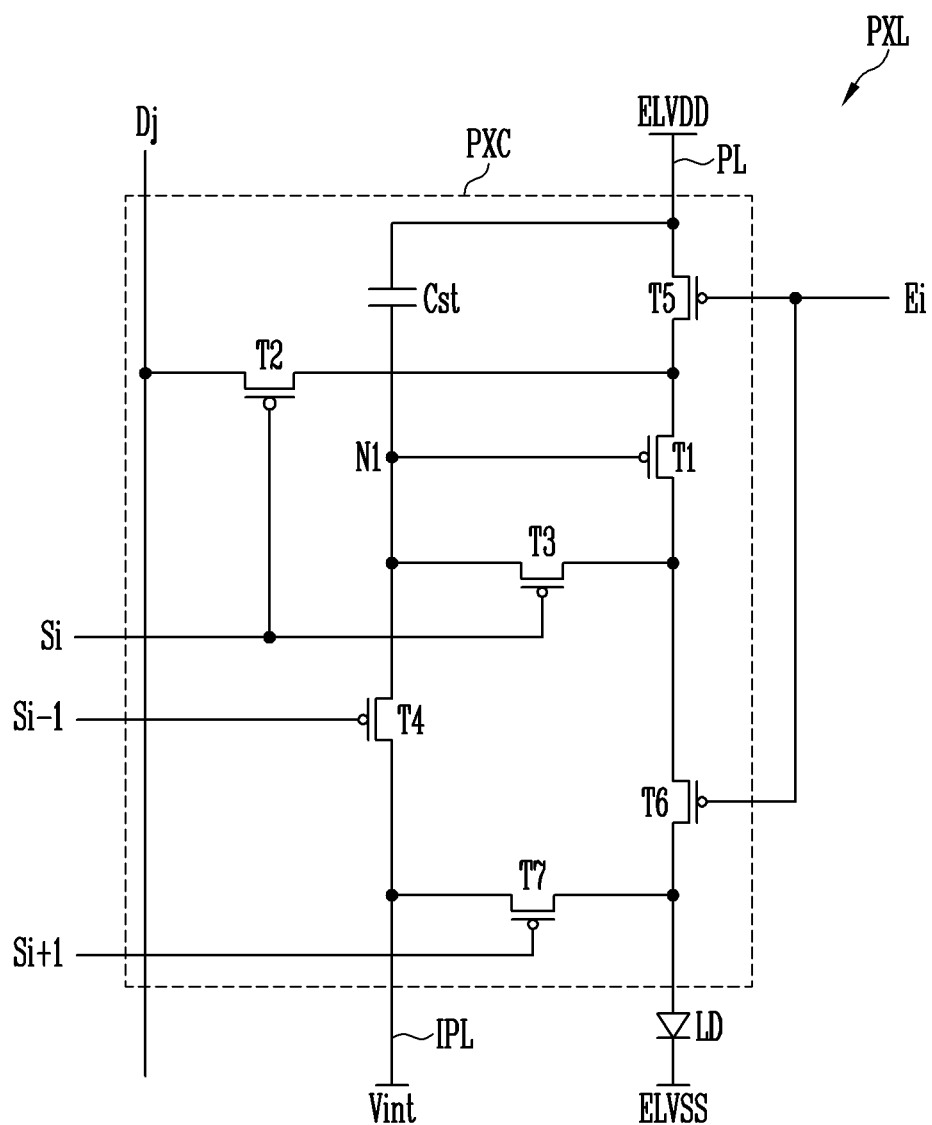
FIG. 2 is an equivalent circuit diagram illustrating a pixel driving circuit of each pixel included in the display device shown in FIG. 1.

FIG. 2 is an equivalent circuit diagram illustrating a pixel driving circuit of each pixel included in the display device shown in FIG. 1.

Each pixel included in the display device 1 in accordance with an embodiment may include a pixel driving circuit PXC.

The pixel driving circuit PXC may include first to seventh transistors T1 to T7 and a storage capacitor Cst. The pixel driving circuit PXC may be electrically connected to a light emitting element LD.

A first electrode of the first transistor T1 may be electrically connected to a first power source ELVDD via the fifth transistor T5, and a second electrode of the first transistor T1 may be electrically connected to an anode electrode of the light emitting diode LD via the sixth transistor T6. The first transistor T1 may control current data flowing from the first power source ELVDD to a second power source ELVSS via the light emitting element LD, based on information on a voltage of a first node N1. The first transistor T1 may be a driving transistor.

The second transistor T2 may be electrically connected between the first electrode of the first transistor T1 and a jth data line Dj. A gate electrode of the second transistor T2 may be electrically connected to an ith scan line Si. The second transistor T2 may be turned on when a scan signal may be applied from the ith scan line Si, and electrically connect the jth data line Dj to the first electrode of the first transistor T1. The second transistor T2 may be a switching transistor.

The third transistor T3 may be electrically connected between the second electrode of the first transistor T1 and the first node N1. The third transistor T3 may be turned on when a scan signal having a gate-on voltage may be applied from the ith scan line Si, and electrically connect the second electrode of the first transistor T1 to the first node N1.

The fourth transistor T4 may be electrically connected between the first node N1 and an initialization power line IPL to which an initialization power source Vint may be applied. A gate electrode of the fourth transistor T4 may be electrically connected to an (i−1)th scan line Si−1. The fourth transistor T4 may be turned on when a scan signal may be applied to the (i−1)th scan line Si−1, to supply a voltage of the initialization power source Vint to the first node N1. The fourth transistor T4 may be an initialization transistor.

The fifth transistor T5 may be electrically connected between a power line PL to which the first power source ELVDD may be applied and the first transistor T1. A gate electrode of the fifth transistor T5 may be electrically connected to an emission control line Ei. A gate electrode of the fifth transistor T5 may be electrically connected to the ith emission control line Ei. The fifth transistor T5 may be turned off when an emission control signal having a gate-off voltage (for example, a high level voltage) may be applied to the ith emission control line Ei, and may be turned on in other cases.

The sixth transistor T6 may be electrically connected between the first transistor T1 and the light emitting element LD. A gate electrode of the sixth transistor T6 may be electrically connected to the ith emission control line Ei. The sixth transistor T6 may be turned off when the emission control signal having the gate-off voltage may be applied from the ith emission control line Ei, and may be turned on in other cases.

The seventh transistor T7 may be electrically connected between the initialization power line IPL and the anode electrode of the light emitting element LD. A gate electrode of the seventh transistor T7 may be electrically connected to an (i+1)th scan line Si+1. The seventh transistor T7 may be turned on when a scan signal having a gate-on voltage (for example, a low level voltage) may be applied from the (i+1)th scan line Si+1, to supply the voltage of the initialization power source Vint to the anode electrode of the light emitting element LD. Although a case where the gate electrode of the seventh transistor T7 may be electrically connected to the (i+1)th scan line Si+1 has been illustrated in FIG. 2, the disclosure is not limited thereto. In an example, the gate electrode of the seventh transistor T7 may be electrically connected to the ith scan line Si. The seventh transistor T7 may be turned on by the scan signal having the gate-on voltage, which may be applied from the ith scan line Si.

The voltage of the initialization power source Vint may be set as a voltage lower than that of a data signal. For example, the voltage of the initialization power source Vint may be set equal to or lower than a lowest voltage of the data signal.

The storage capacitor Cst may be electrically connected between the power line PL to which the first power source ELVDD may be applied and the first node N1. The storage capacitor Cst may store information on a voltage corresponding to the data signal and a threshold voltage of the first transistor T1.

The anode electrode of the light emitting element LD may be electrically connected to the first transistor T1 via the sixth transistor T6. A cathode electrode of the light emitting element LD may be electrically connected to the second power source ELVSS.

The light emitting element LD may emit light with a predetermined luminance corresponding to an amount of current supplied from the first transistor T1. A voltage value of the first power source ELVDD may be set higher than that of the second power source ELVSS such that a current may flow through the light emitting element LD.

The light emitting element LD may be an organic light emitting diode, an inorganic light emitting diode such as a micro LED (light emitting diode) or a quantum dot light emitting diode. Alternatively, the light emitting element LD may be a light emitting element made of a combination of an organic material and an inorganic material.

In FIG. 2, it is illustrated that the pixel PXL may include a single light emitting element LD. However, in an embodiment, the pixel PXL may include light emitting elements LD, and the light emitting elements LD may be electrically connected in parallel, series, or series/parallel to each other.

Hereinafter, a case where the light emitting element LD included in the display device 1 may be an organic light emitting diode (OLED) will be described for convenience.

Additionally, although a case where the pixel PXL is driven by using the ith scan line Si, an (i−1)th scan line Si−1, and the (i+1)th scan line Si+1 has been described in FIG. 2, the disclosure is not limited thereto. In an example, the ith scan line Si, an (i−1)th scan line Si−1, and the (i+1)th scan line Si+1 may be separate signal lines supplied with scan signals from different scan drivers SDV.

Figure 3:
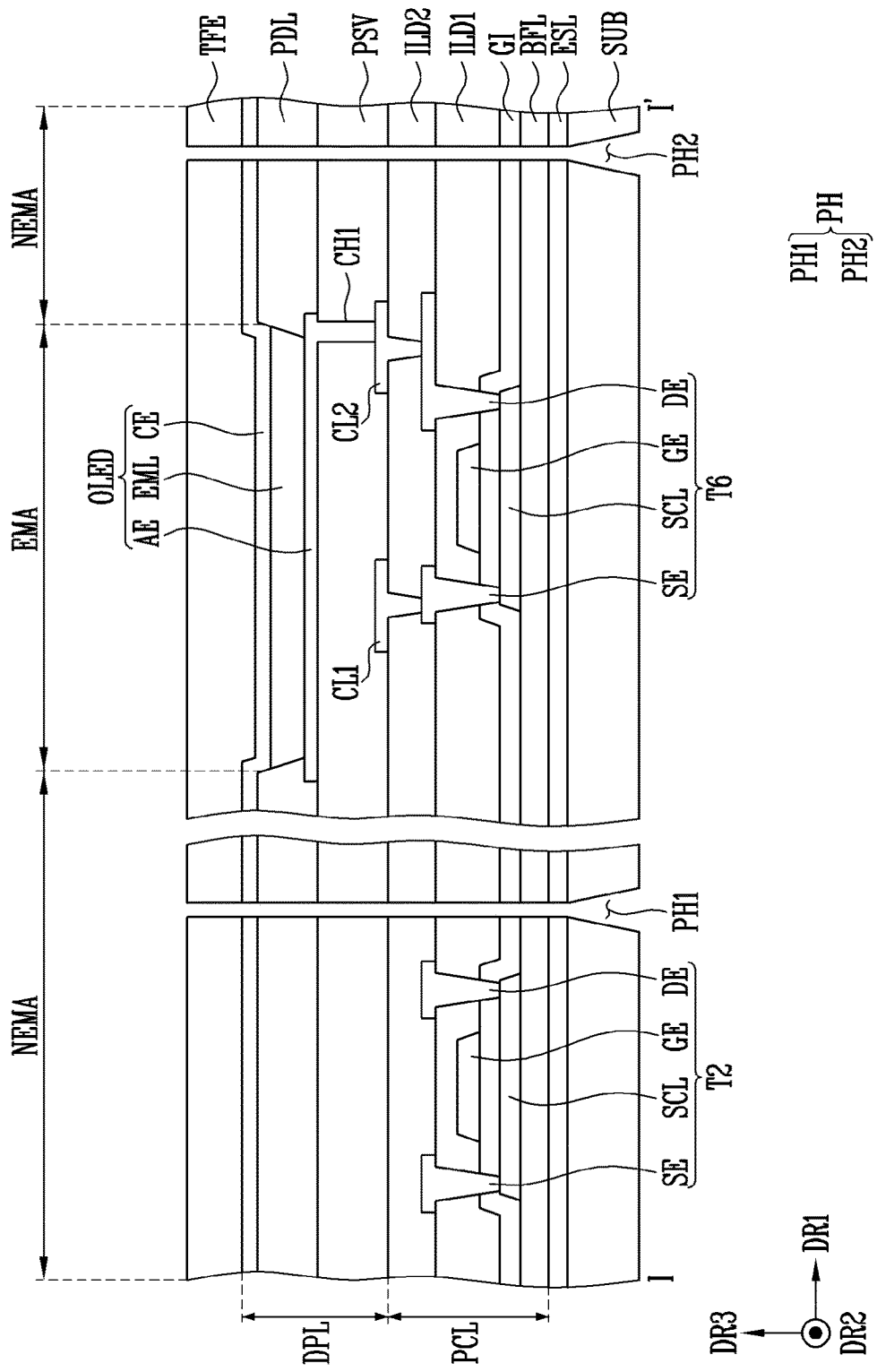
FIG. 3 is a schematic cross-sectional view taken along line I-I' shown in FIG. 1.

FIG. 3 is a schematic cross-sectional view taken along line I-I' shown in FIG. 1.

Hereinafter, a section of a portion corresponding to each of the second transistor T2 and the sixth transistor T6 among the first to seventh transistors T1 to T7 shown in FIG. 2 is illustrated for convenience of description.

Referring to FIG. 3, the display device 1 may include a substrate SUB, an etch stopper layer ESL, a pixel circuit layer PCL, a display element layer DPL, a thin film encapsulation layer TFE, and penetrating-holes PH penetrating the above-described layers.

The substrate SUB may include a rigid material or a flexible material. The flexible material may include at least one of polystyrene, polyvinyl alcohol, polymethyl methacrylate, polyethersulfone, polyacrylate, polyetherimide, polyethylene naphthalate, polyethylene terephthalate, polyphenylene sulfide, polyarylate, polyimide, polycarbonate, triacetate cellulose, and cellulose acetate propionate.

The substrate SUB may include a first hole (see 111' shown in FIG. 10) of the penetrating-hole PH including a cavity or an aperture therein. The penetrating-hole PH may include first and second penetrating-holes PH1 and PH2. For convenience, only two penetrating-holes PH are illustrated in FIG. 3, but the number and individual positions of the penetrating-holes PH are not limited thereto.

When viewed in a plan view, the first and second penetrating-holes PH1 and PH2 may be located or disposed in a non-emission area NEMA which may not overlap an organic light emitting diode OLED. For example, when viewed in a plan view, the first and second penetrating-holes PH1 and PH2 may not overlap an emission area EMA in which the organic light emitting diode OLED may be located or disposed.

The etch stopper layer ESL may be located or disposed on the substrate SUB. At least a portion of the etch stopper layer ESL may be arranged or disposed on the substrate SUB.

The etch stopper layer ESL may include a second hole (H2 shown in FIG. 10) of the penetrating-hole PH. The second hole H2 of the penetrating-hole PH, which may be formed in the etch stopper layer ESL, may be fluidically connected to the first hole H1 of the penetrating-hole PH, which may be formed in the substrate SUB. Fluidically connected may mean continuously connect to form a cavity or an aperture.

In a case that an etching process for forming a predetermined hole formed in the substrate SUB is performed, the etch stopper layer ESL may reduce influence on an individual component of the display device 1 due to the etching process. For example, in a case that an etching process for forming the first hole H1 in the substrate SUB is performed, the etch stopper layer ESL may reduce influence on a buffer layer BFL due to the etching process.

The etch stopper layer ESL may include a material having low influence due to an etching process. For example, the etch stopper layer ESL may include at least amorphous carbon (a-C). The amorphous carbon may mean a material which does not have a predetermined crystal structure, and may include carbon in an amorphous state having high reactivity. The amorphous carbon has a low wet etching speed, and hence damage of the buffer layer BFL may be reduced in a case that a wet etching process for forming the first hole H1 in the substrate SUB is performed.

By way of example, in a case that the buffer layer BFL may include silicon nitride (SiNx) or silicon oxide (SiOx), influence due to the wet etching process may be higher, and the damage of the buffer layer BFL may be further reduced by the etch stopper layer ESL in accordance with the disclosure.

By way of example, a wet etch rate of the silicon nitride (SiNx) may be about 3 Å/s or more in a case that an etchant of about 0.9% may be used, and a wet etch rate of the silicon oxide (SiOx) may be about 5 Å/s or more in a case that the etchant of about 0.9% may be used. On the other hand, a layer including amorphous carbon may have a relatively low wet etch rate. The layer including the amorphous carbon may have a wet etch rage of about 0.5 Å/s or less when potassium hydroxide (KOH) of about 27 wt % may be used at about 80° C. Alternatively, the layer including the amorphous carbon may, for example, have a wet etch rate of about 0 when an etchant in which hydrofluoric acid (HF) of about 49% and distilled water are mixed at a ratio of about 1:9 may be used.

Consequently, a wet etch rate of the etch stopper layer ESL including the amorphous carbon is extraordinarily low as compared with that of the buffer layer including the silicon nitride (SiNx) and/or the silicon oxide (SiOx), and the buffer layer BFL may be more efficiently protected by the etch stopper layer ESL including the amorphous carbon, in a case that the penetrating-hole PH may be formed in the substrate SUB.

In an embodiment, the etch stopper layer ESL may serve as a light blocking layer for a semiconductor pattern SCL which will be described later. The etch stopper layer ESL may overlap the semiconductor pattern SCL in the third direction DR3. The etch stopper layer ESL may decrease transmittance of light having an UV wavelength band. Therefore, light to be applied to the semiconductor pattern SCL may be blocked according to progress of a predetermined process or a peripheral environment.

The pixel circuit layer PCL may be located or disposed on the etch stopper layer ESL. The pixel circuit layer PCL may include the buffer layer BFL, a gate insulating layer GI, the second transistor T2, the sixth transistor T6, a first interlayer insulating layer ILD1, a second interlayer insulating layer ILD2, a first conductive line CL1, and a second conductive line CL2.

The pixel circuit layer PCL may include a partial area of the penetrating-hole PH. The penetrating-hole PH corresponding to the pixel circuit layer PCL may be located or disposed in the non-emission area NEMA. For example, the first penetrating-hole PH1 and the second penetrating-hole PH2, which may correspond to the pixel circuit layer PCL, may not be located or disposed in the emission area EMA.

The buffer layer BFL may be located or disposed on the etch stopper layer ESL. The buffer layer BFL may be disposed on the substrate SUB to cover or overlap at least a portion of the etch stopper layer ESL.

The buffer layer BFL may prevent an impurity from being diffused into the sixth transistor T6 and/or the second transistor T2.

The buffer layer BFL may include at least one of silicon nitride (SiNx), silicon oxide (SiOx), silicon oxynitride (SiOxNy), and metal oxide such as aluminum oxide (AlOx).

The second transistor T2 may be located or disposed in the non-emission area NEMA, and the sixth transistor T6 may be located or disposed in the emission area EMA. However, the disclosure is not limited thereto. In an embodiment, the second transistor T2 may be located or disposed in the emission area EMA.

Each of the second transistor T2 and the sixth transistor T6 may include a semiconductor pattern SCL, a source electrode SE, a drain electrode DE, and a gate electrode GE.

The semiconductor pattern SCL may be located or disposed on the buffer layer BFL.

The semiconductor pattern SCL may be a semiconductor layer. In accordance with an embodiment, the semiconductor pattern SCL may include at least one of poly-silicon, amorphous silicon, and an oxide semiconductor.

The semiconductor pattern SCL may include a first contact region in contact with the source electrode SE and a second contact region in contact with the drain electrode DE. Each of the first contact region and the second contact region may be a semiconductor pattern doped with an impurity. A region between the first contact region and the second contact region may be a channel region. The channel region may be an intrinsic semiconductor pattern undoped with the impurity.

The gate insulating layer GI may be provided or disposed over the semiconductor pattern SCL. The gate insulating layer GI may include an inorganic material. In accordance with an embodiment, the gate insulating layer GI may include at least one of silicon nitride (SiNx), silicon oxide (SiOx), silicon oxynitride (SiOxNy), and aluminum oxide (AlOx). In an embodiment, the gate insulating layer GI may include an organic material.

The gate electrode GE may be located or disposed on the gate insulating layer GI.

A position of the gate electrode GE may correspond to that of the channel region of the semiconductor pattern SCL. For example, the gate electrode GE may be disposed on the channel region of the semiconductor pattern SCL with the gate insulating layer GI interposed therebetween.

The first interlayer insulating layer ILD1 may be located or disposed over the gate electrode GE. Similar to the gate insulating layer GI, the first interlayer insulating layer ILD1 may include at least one of silicon nitride (SiNx), silicon oxide (SiOx), silicon oxynitride (SiOxNy), and aluminum oxide (AlOx). In an embodiment, the gate insulating layer GI may include an organic material.

The source electrode SE and the drain electrode DE may be located or disposed on the first interlayer insulating layer ILD1. The source electrode SE may penetrate the gate insulating layer GI and the first interlayer insulating layer ILD1, and may be in contact with the first contact region of the semiconductor pattern SCL. The drain electrode DE may penetrate the gate insulating layer GI and the first interlayer insulating layer ILD1, and may be in contact with the second contact region of the semiconductor pattern SCL.

In the above-described embodiment, it has been described that the source electrode SE and the drain electrode DE of each of the second transistor T2 and the sixth transistor T6 are individual electrodes which may penetrate the gate insulating layer GI and the first interlayer insulating layer ILD1 and may be electrically connected to the semiconductor pattern SCL of the corresponding transistor, but the disclosure is not limited thereto. In an embodiment, the source electrode SE of each of the second and sixth transistors T2 and T6 may be one of the first and second contact regions adjacent to the channel region of the semiconductor pattern SCL of the corresponding transistor, and the drain electrode DE of each of the second and sixth transistors T2 and T6 may be the other of the first and second contact regions adjacent to the channel region of the semiconductor pattern SCL of the corresponding transistor. The drain electrode DE of each of the second and sixth transistors T2 and T6 may be electrically connected to a partial configuration of the display element layer DPL through a separate connection means or source including a contact electrode, for example.

The second interlayer insulating layer ILD2 may be located or disposed over the source electrode SE and the drain electrode DE. Similar to the first interlayer insulating layer ILD1 and the gate insulating layer GI, the second interlayer insulating layer ILD2 may include an inorganic material. The inorganic material may include at least one of materials exemplified as the material constituting the first interlayer insulating layer ILD1 and the gate insulating layer GI, for example, silicon nitride (SiNx), silicon oxide (SiOx), silicon oxynitride (SiOxNy), and aluminum oxide (AlOx). In an embodiment, the second interlayer insulating layer ILD2 may include an organic material.

The first conductive line CL1 may be located or disposed on the second interlayer insulating layer ILD2, and may be electrically connected to the source electrode SE through a contact hole penetrating the second interlayer insulating layer ILD2.

The second conductive line CL2 may be located or disposed on the second interlayer insulating layer ILD2, and may be electrically connected to the drain electrode DE through a contact hole penetrating the second interlayer insulating layer ILD2.

Each of the first conductive line CL1 and the second conductive line CL2 may be a path through which an electrical signal may flow. By way of example, the second conductive line CL2 may be a bridge electrode which electrically connects the drain electrode DE of the sixth transistor T6 to a partial configuration of the display element layer DPL. In accordance with an embodiment, the first conductive line CL1 and the second conductive line CL2 may include at least one of molybdenum (Mo), tungsten (W), aluminum-neodymium (AlNd), titanium (Ti), aluminum (Al), and silver (Ag).

The display element layer DPL may be disposed on the pixel circuit layer PCL. The display element layer DPL may include a protective layer PSV, a first contact hole CH1, a pixel defining layer PDL, and the organic light emitting diode OLED.

The protective layer PSV may be provided or disposed over the first conductive line CL1 and the second conductive line CL2. The protective layer PSV may be provided or disposed in a form including an organic insulating layer, an inorganic insulating layer, or the organic insulating layer disposed on the inorganic insulating layer.

The protective layer PSV may include the first contact hole CH1 exposing one or a region of the second conductive line CL2.

The first contact hole CH1 may be a path through which an electrical signal provided from the sixth transistor T6 may be transferred.

The display element layer DPL may include a partial area of the penetrating-hole PH. The penetrating-hole PH may penetrate at least a portion of the display element layer DPL.

The penetrating-hole PH corresponding to the display element layer DPL may be located or disposed in the non-emission area NEMA. The penetrating-hole PH may penetrate the non-emission area NEMA of the display element layer DPL. For example, the first penetrating-hole PH1 and the second penetrating-hole PH2, which may correspond to the display element layer DPL may not be located or disposed in the emission area EMA.

The pixel defining layer PDL may define an emission area of each pixel PXL. The pixel defining layer PDL may include an organic material. In accordance with an embodiment, the pixel defining layer PDL may include at least one of acryl resin, epoxy resin, phenolic resin, polyamide resin, and polyimide resin.

The organic light emitting diode OLED may include a first electrode AE, an emitting layer EML, and a second electrode CE. The organic light emitting diode OLED may be disposed on the protective layer PSV in the display area DA.

One of the first and second electrodes AE and CE may be an anode electrode, and the other of the first and second electrodes AE and CE may be a cathode electrode. In a case that the organic light emitting diode OLED may be a top-emission organic light emitting diode, the first electrode AE may be a reflective electrode, and the second electrode CE may be a transmissive electrode. Hereinafter, a case where the organic light emitting diode OLED is the top-emission organic light emitting diode, and the first electrode AE is the anode electrode will be described as an example.

The first electrode AE may be located or disposed on the protective layer PSV in the display area DA. The first electrode AE may be electrically connected to the second conductive line CL2 through the first contact hole CH1. The first electrode AE may include a reflective layer (not shown) that may reflect light or a transparent conductive layer (not shown) disposed on the top or the bottom of the reflective layer. In an example, the first electrode AE may be a multi-layer include a lower transparent conductive layer made of indium tin oxide (ITO), a reflective layer which may be provided or disposed on the lower transparent conductive layer and may be made of silver (Ag), and an upper transparent conductive layer which may be provided or disposed on the reflective layer and may be made of ITO. At least one of the transparent conductive layer and the reflective layer may be electrically connected to the drain electrode DE of the sixth transistor T6 through the first contact hole CH1.

The emitting layer EML may be disposed in an opening of the pixel defining layer PDL. An area exposed by the opening of the pixel defining layer PDL and/or an area in which the emitting layer EML may be disposed may be the emission area EMA in which light may be emitted. The emitting area EML may include an organic material.

By way of example, the emitting layer EML may have a multi-layered thin film structure including at least a light generation layer. The emitting layer EML may include a hole injection layer for injecting holes, a hole transport layer having an excellent hole transporting property, the hole transport layer for increasing the opportunity for holes and electrons to be re-combined by suppressing the movement of electrons that fail to be combined in the light generation layer, the light generation layer for emitting light through the re-combination of the injected electrons and holes, a hole blocking layer for suppressing the movement of holes that fail to be combined in the light generation layer, an electron transport layer smoothly transporting electrons to the light generation layer, and an electron injection layer for injecting electrons. As described above, in a case that an electrical signal may be applied to the emitting layer EML, light may be emitted. The color of light generated in the emitting layer EML may be one of red, green, blue, and white, but is not limited thereto. For example, the color of light generated in the emitting layer EML may also be one of magenta, cyan, and yellow.

The second electrode CE may be provided or disposed over the emitting layer EML. The second electrode CE may be provided or disposed in the form of a common electrode disposed on the entire surface of the substrate SUB, but the disclosure is not limited thereto. The second electrode CE may include a transparent conductive material (or substance) such as one transparent conductive oxide among indium tin oxide (ITO), indium zinc oxide (IZO), aluminum zinc oxide (AZO), gallium doped zinc oxide (GZO), zinc tin oxide (ZTO), gallium tin oxide (GTO), indium gallium zinc oxide (IGZO), and fluorine doped tin oxide (FTO). In an embodiment, in a case that the organic light emitting diode OLED may be a bottom-emission organic light emitting diode, the second electrode CE may include a translucent conductive material (or substance) such as magnesium (Mg), silver (Ag), or an alloy of magnesium (Mg) and silver (Ag).

The thin film encapsulation layer TFE may be located or disposed on the second electrode CE. The thin film encapsulation layer TFE may include insulating layers covering or overlapping the organic light emitting diode OLED. By way of example, the thin film encapsulation layer TFE may include at least one inorganic layer and/or at least one organic layer. For example, the thin film encapsulation layer TFE may have a structure in which inorganic and organic layers may be alternately stacked.

Hereinafter, a manufacturing method of a display device in accordance with an embodiment will be described in detail later with reference to FIGS. 4 to 10. For convenience of description, a structure of the pixel circuit layer PCL and the display element layer DPL will be omitted, and a structure of a partial area of the display device including the etch stopper layer ESL will be described in detail.

Figure 4:
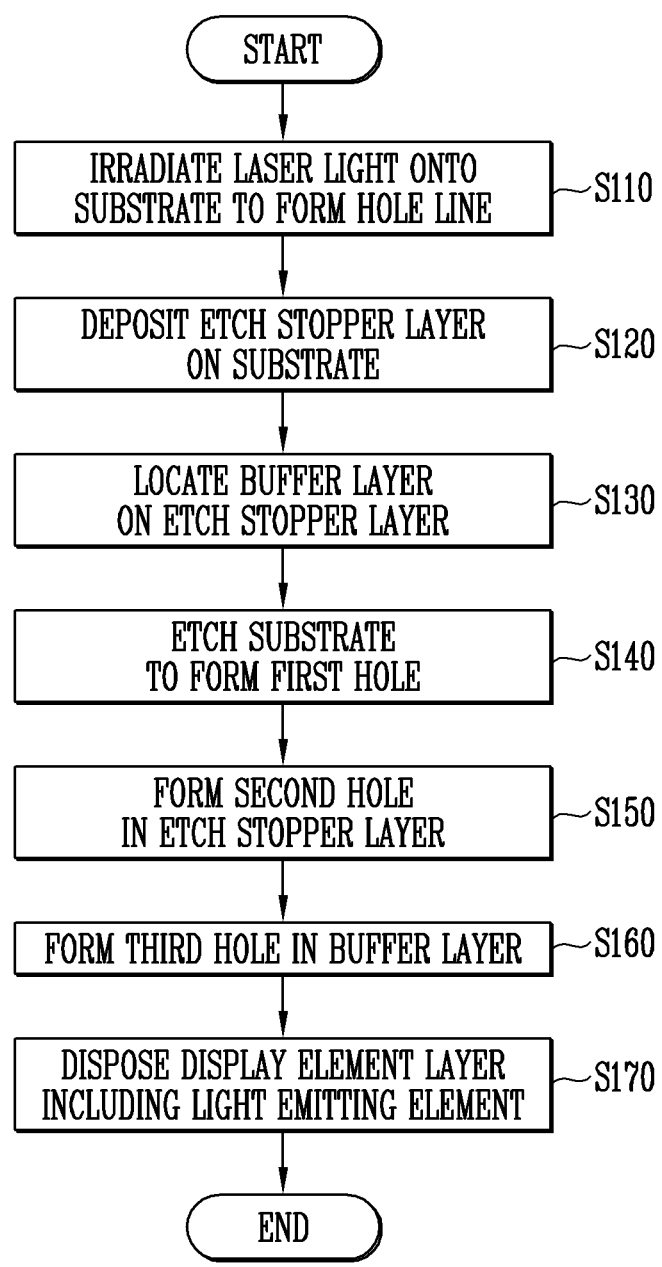
FIG. 4 is a flowchart illustrating a manufacturing method of a display device in an embodiment.

FIG. 4 is a flowchart illustrating a manufacturing method of a display device in an embodiment.

FIGS. 5 to 10 are process sectional views illustrating the manufacturing method shown in FIG. 4.

Referring to FIG. 4, the manufacturing method of the display device in accordance with an embodiment may include a step of irradiating a laser light onto a substrate to form a hole line (S110), a step of depositing an etch stopper layer on the substrate (S120), a step of locating or depositing a buffer layer on the etch stopper layer (S130), a step of etching the substrate to form a first hole (S140), a step of forming a second hole in the etch stopper layer (S150), a step of forming a third hole in the buffer layer (S160), and a step of disposing a display element layer including a light emitting element (S170).

Figure 5:
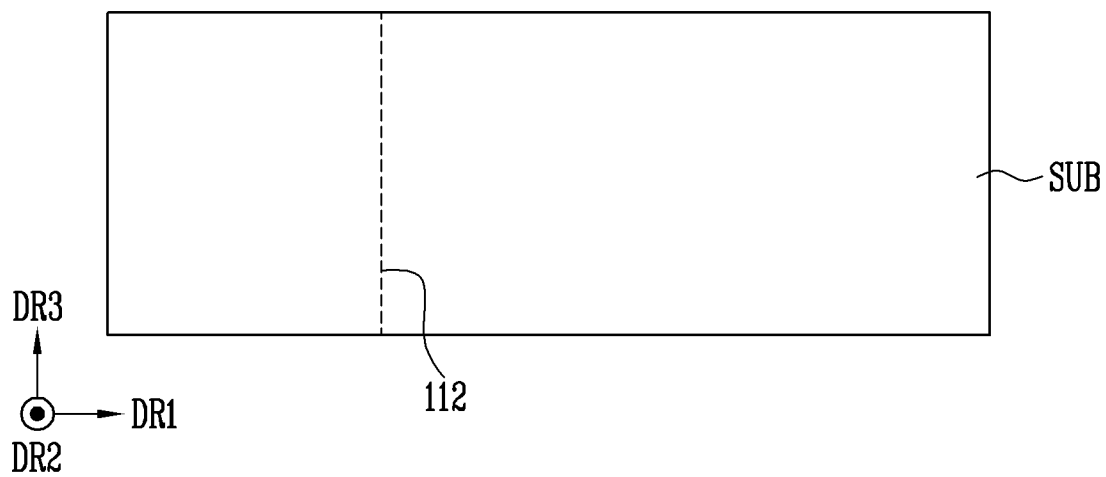
FIGS. 5 to 10 are process sectional views illustrating the manufacturing method shown in FIG. 4.

In the irradiating step (S110), a predetermined laser light may be irradiated onto a substrate SUB. Referring to FIG. 5, in this step, a hole line 112 may be formed in a thickness direction of the substrate SUB, for example, the third direction DR3. In a case that the predetermined laser light is irradiated, at least a portion of an irradiation area of the substrate SUB may be removed, or a property of the substrate SUB in the irradiation area may be changed, so that the hole line 112 may be provided or formed.

Figure 6:
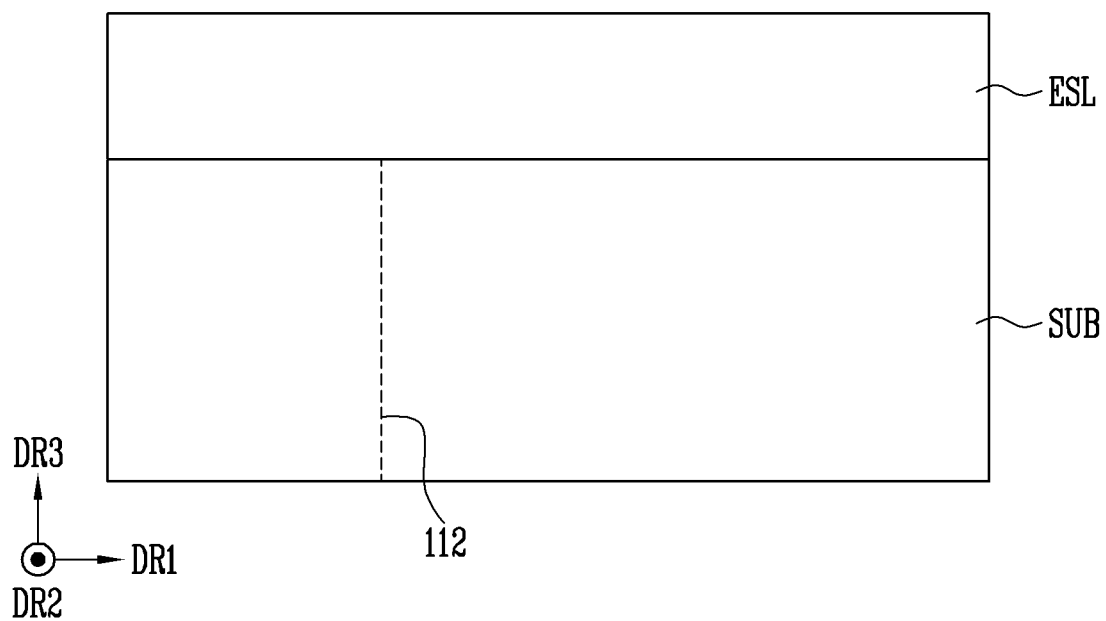
Figure 7:
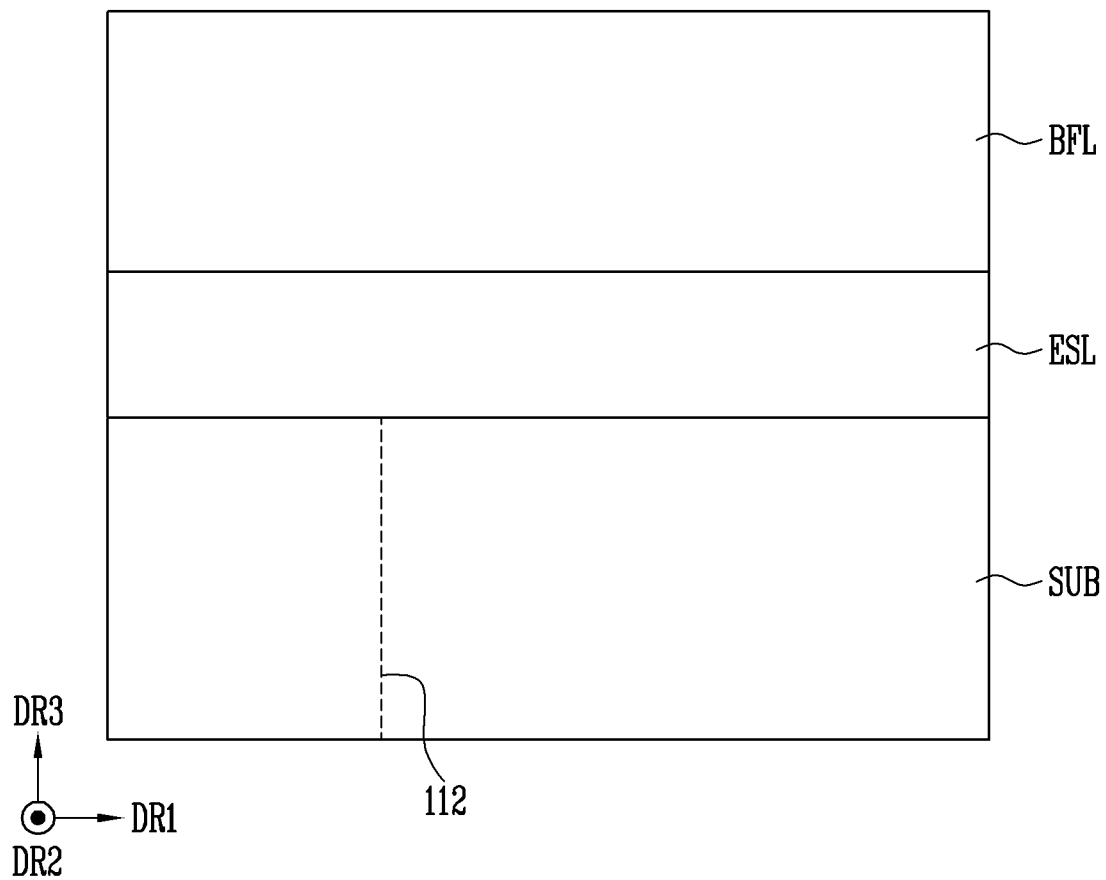
Figure 8:
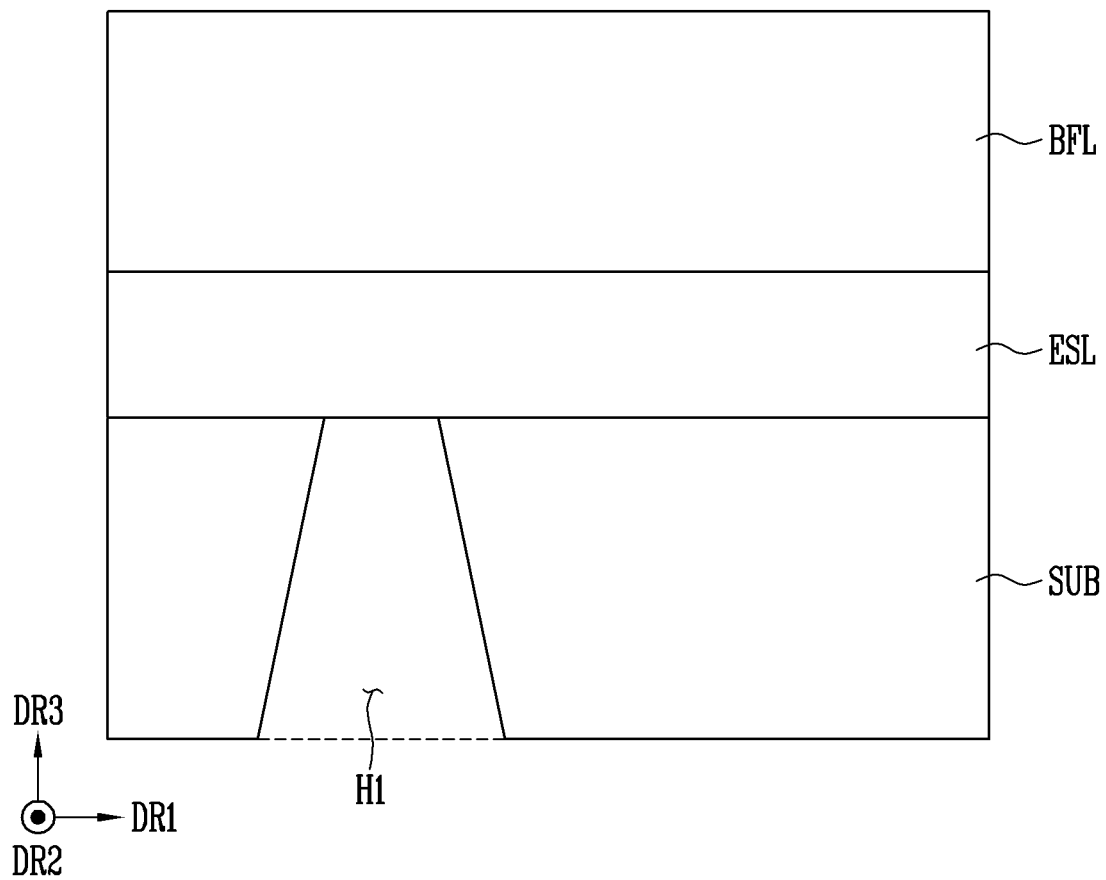
Figure 9:
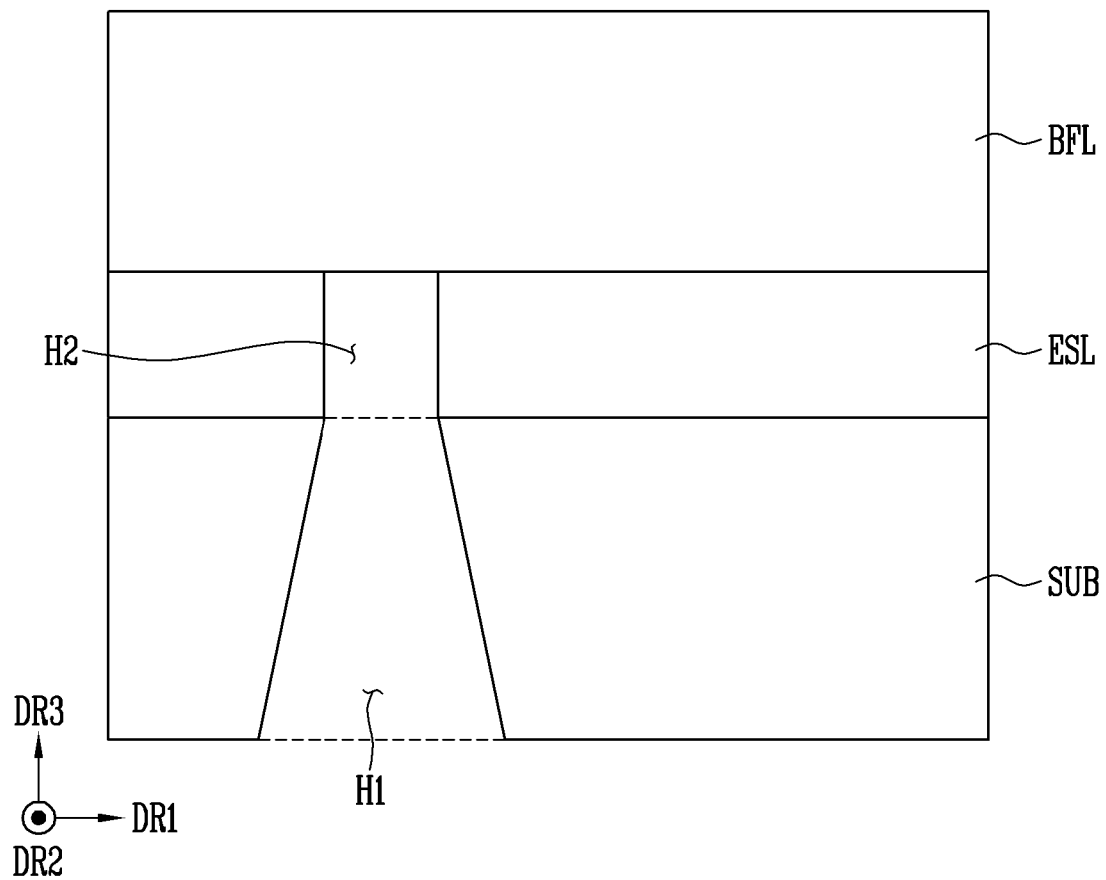
Figure 10:
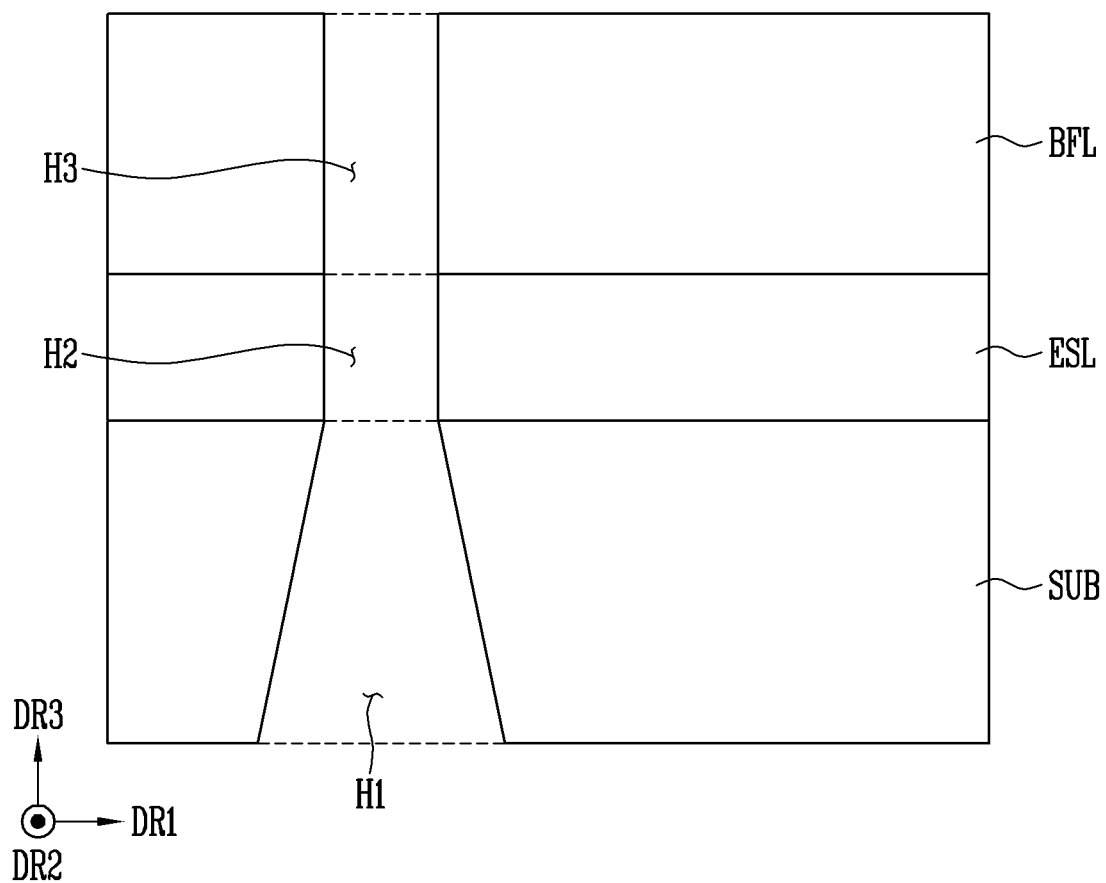

In the depositing step (S120), an etch stopper layer ESL may be deposited on the substrate SUB. Referring to FIG. 6, the deposited etch stopper layer ESL may at least cover or overlap the hole line 112. In the depositing step (S120), the etch stopper layer ESL may be formed through a chemical vapor deposition (CVD) process. In a case that the etch stopper layer ESL is deposited through the CVD process, any separate organic layer curing time is not required as compared with in a case that an organic layer may be formed through a photo process, so that a process time may be reduced. Further, in this step, in a case that the etch stopper layer ESL is deposited through the CVD process, any separate patterning process is not required, unlike a sputtering process, so that a number of masks required in a case that a process is performed may be decreased.

In the locating step (S130), a buffer layer BFL may be disposed on the etch stopper layer ESL. In this step, the buffer layer BFL may be deposited on the etch stopper layer ESL through the CVD process. For example, in an embodiment, both the etch stopper layer ESL and the buffer layer BFL may be stacked through the CVD process. The CVD process may be continuously performed on each layer, and thus process cost may be decreased.

Although not shown in the drawing, in an embodiment, in a case that the etch stopper layer ESL is not deposited in a partial area on the substrate SUB, the buffer layer BFL may be located or disposed on the substrate SUB on which the etch stopper layer ESL may not be deposited in this step.

In the substrate etching step (S140), at least a portion of the substrate SUB may be removed through an etching process. In accordance with an embodiment, the etching process performed in this step may be a wet etching process. An etchant used in the wet etching process may include hydrofluoric acid (HF) or potassium hydroxide (KOH), but the disclosure is not limited to a specific example.

In this step, a first hole H1 penetrating the substrate SUB may be provided by removing an area of the substrate SUB, which may correspond to the hole line 112 formed in the irradiating step S110. The first hole H1 may penetrate the substrate SUB in the third direction DR3. The first hole H1 may have a sectional area narrowed in the third direction DR3.

In a case that the wet etching process is performed in the substrate etching step (S140), influence on the buffer layer BFL may be reduced by the etch stopper layer ESL. For example, even in a case that the substrate etching step (S140) is performed later than the locating step (S130), external influence on the buffer layer BFL may be attenuated by the etch stopper layer ESL deposited earlier than the buffer layer BFL.

In the second hole forming step (S150), a second hole H2 may be formed by removing at least a portion of the etch stopper layer ESL. In this step, the second hole H2 fluidically connected to the first hole H1 may be provided. For example, the second hole H2 may be formed to overlap the first hole H1 in the third direction DR3. The second hole H2 may have a substantially uniform sectional area in the third direction DR3.

In the second hole forming step S150, an $O_2$ ashing process may be performed on the etch stopper layer ESL. Since amorphous carbon may be included in the etch stopper layer ESL as described above, the efficiency of the $O_2$ ashing process performed on the etch stopper layer ESL may be improved.

In the third hole forming step S160, a third hole H3 may be formed by removing at least a portion of the buffer layer BFL. In this step, the third hole H3 fluidically connected to the second hole H2 may be provided. For example, the third hole H3 may be formed to overlap the second hole H2 in the third direction DR3. The third hole H3 may have a substantially uniform sectional area in the third direction DR3.

Consequently, the first hole H1, the second hole H2, and the third hole H3 may be provided or formed as a single cavity or aperture.

In the third hole forming step (S160), an etching process may be performed on a partial area of the buffer layer BFL. In accordance with an embodiment, in this step, a dry etching process may be performed on the buffer layer BFL.

Meanwhile, the third hole forming step (S160) may be performed during the same process as the second hole forming step S150. For example, the third hole forming step (S160) and the second hole forming step S150 may be performed during a single process, so that an additional process may be omitted. Accordingly, process cost may be reduced.

In the display element layer disposing step (S170), a display element layer DPL including a light emitting element (see ID' shown in FIG. 2) may be provided or disposed. As described above, the light emitting element LD may mean a component which may emit light in a case that an electrical signal may be applied. The light emitting element LD may be disposed not to overlap the first hole H1, the second hole H2, and the third hole H3.

Hereinafter, an embodiment will be described. In the following embodiment, components identical to those described above are designated by like reference numerals, and overlapping descriptions will be omitted or simplified.

Figure 11:
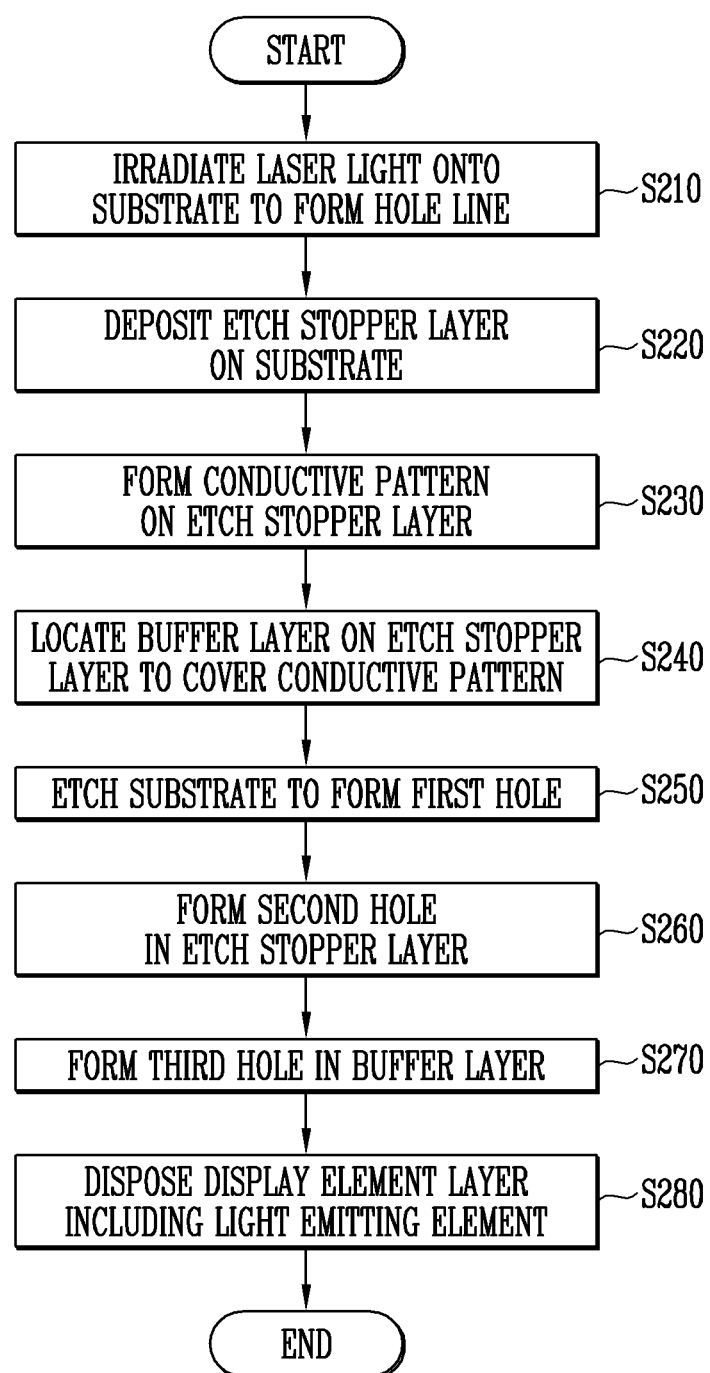
FIG. 11 is a flowchart illustrating a manufacturing method of a display device in accordance with an embodiment.

FIG. 11 is a flowchart illustrating a manufacturing method of a display device in accordance with an embodiment.

Figure 12:
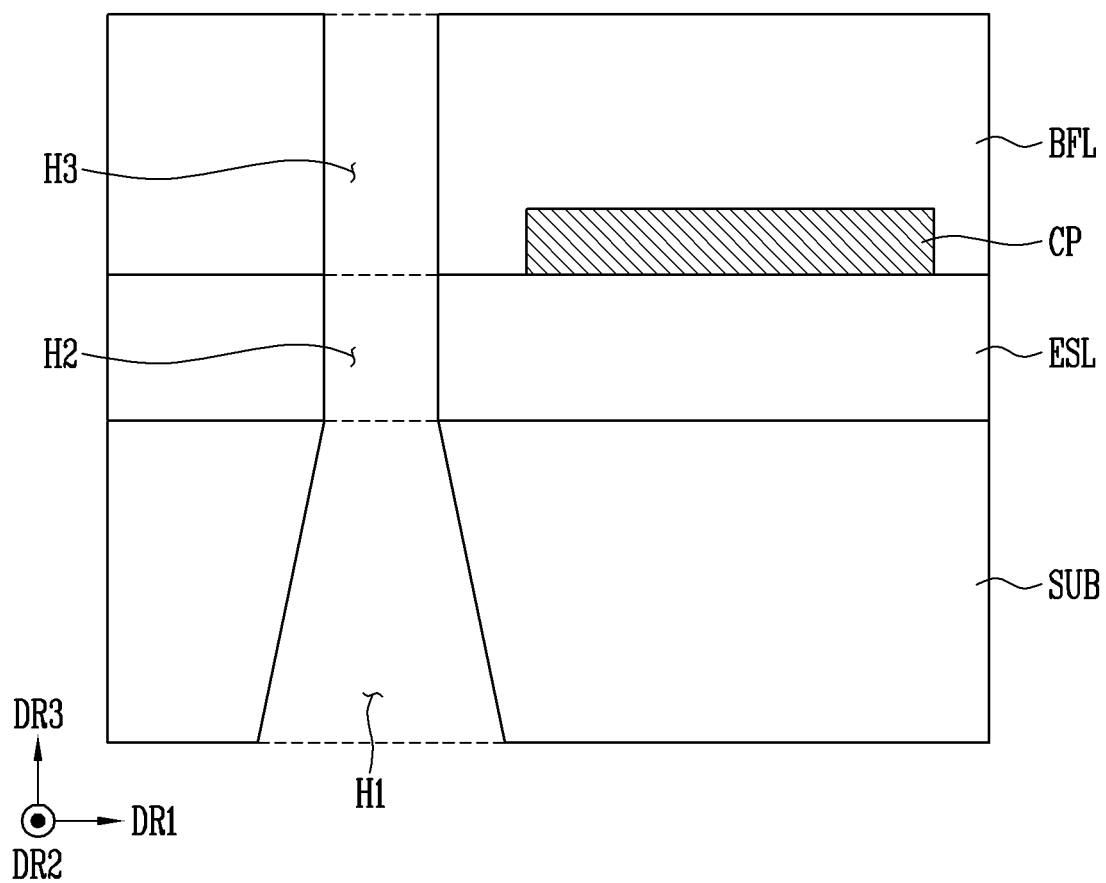
FIG. 12 is a schematic cross-sectional view illustrating a display device in accordance with an embodiment.

FIG. 12 is a schematic cross-sectional view illustrating a display device in accordance with an embodiment.

Referring to FIG. 11, a manufacturing method of a display device in accordance with a modification of the disclosure may include a step of irradiating a laser light onto a substrate to form a hole line (S210), a step of depositing an etch stopper layer on the substrate (S220), a step of forming a conductive pattern on the etch stopper layer (S230), a step of locating or depositing a buffer layer on the etch stopper layer to cover or overlap the conductive pattern (S240), a step of etching the substrate to form a first hole (S250), a step of forming a second hole in the etch stopper layer (S260), a step of forming a third hole in the buffer layer (S270), and a step of disposing a display element layer including a light emitting element (S280).

In the laser light irradiating step (S210), a predetermined hole line may be formed in the substrate SUB. In the etch stopper layer depositing step (S220), an etch stopper layer ESL may be deposited on the substrate SUB through a predetermined process (for example, a chemical vapor deposition (CVD) process).

After the etch stopper layer depositing step (S220), the conductive pattern forming step (S230) may be performed. In this step, a conductive pattern (see 'CP' shown in FIG. 12) may be provided through a sputtering process. The conductive pattern CP may be patterned on the etch stopper layer ESL to overlap a semiconductor pattern (see 'SCL' shown in FIG. 3) in the third direction D3.

Referring to FIG. 12, an area corresponding to the position at which the conductive pattern CP may be disposed may not be removed through an etching process. The conductive pattern CP may be disposed not to overlap a first hole H1, a second hole H2, and a third hole H3.

In the buffer layer locating step (S240), a buffer layer BFL may be provided or disposed on the etch stopper layer ESL, and at least the conductive pattern CP may be covered or overlapped. The buffer layer BFL may be located or disposed on the etch stopper layer ESL on which the conductive pattern CP may not be located or disposed, and at least a portion of the buffer layer BFL may be located or disposed on the conductive pattern CP.

In the substrate etching step (S250), an etching process may be performed on the substrate SUB to form the first hole H1. In the second hole forming step (S260), an $O_2$ ashing process may be performed on the etch stopper layer ESL. In the third hole forming step (S270), the third hole H3 may be provided by performing an etching process on the buffer layer BFL to form a void corresponding to the second hole H2. In the display element layer disposing step (S280), a light emitting element LD may be provided, which may emit light in a case that an electrical signal may be applied.

Figure 13:
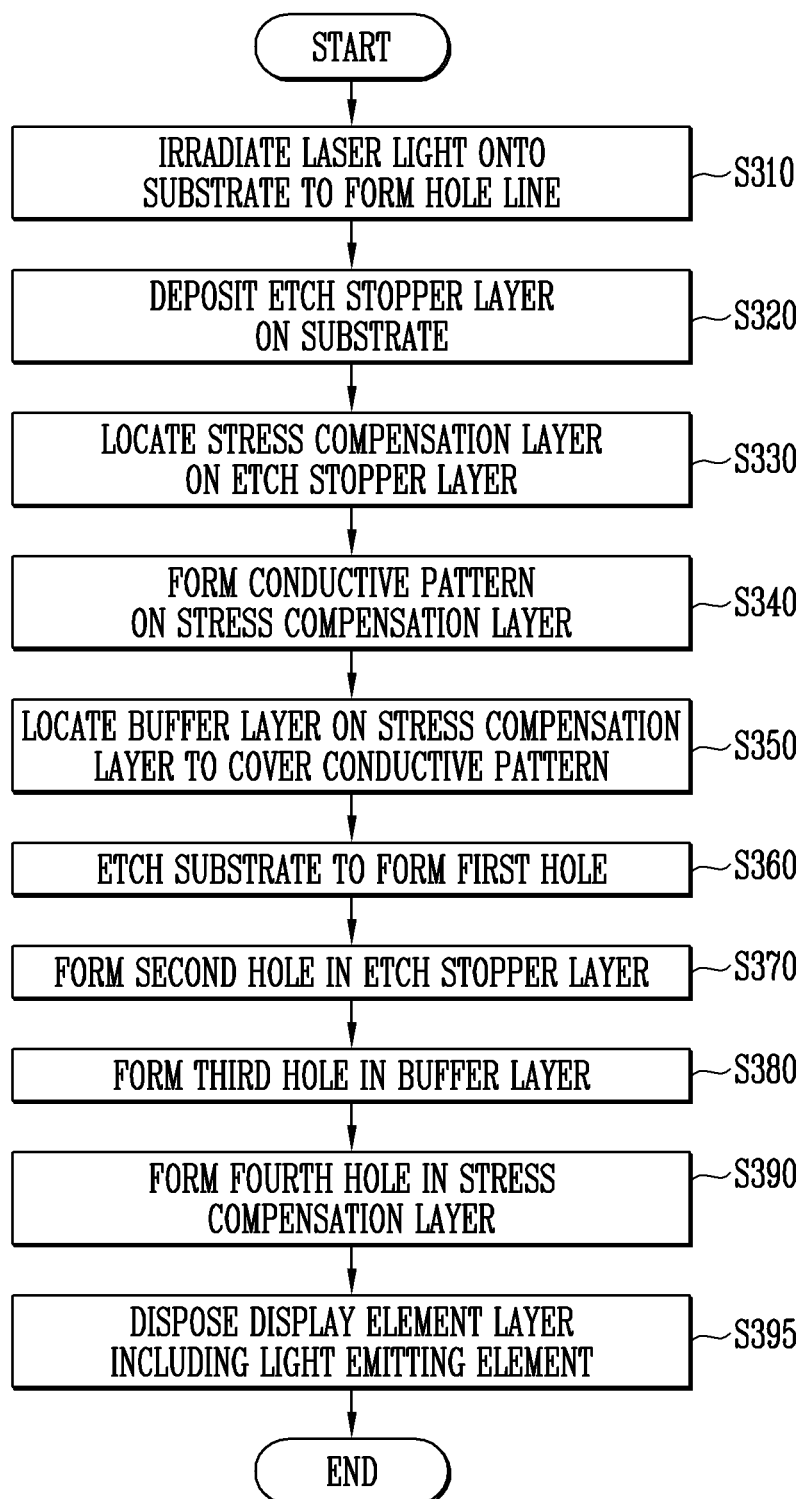
FIG. 13 is a flowchart illustrating a manufacturing method of a display device in accordance with an embodiment.

FIG. 13 is a flowchart illustrating a manufacturing method of a display device in accordance with an embodiment.

Figure 14:
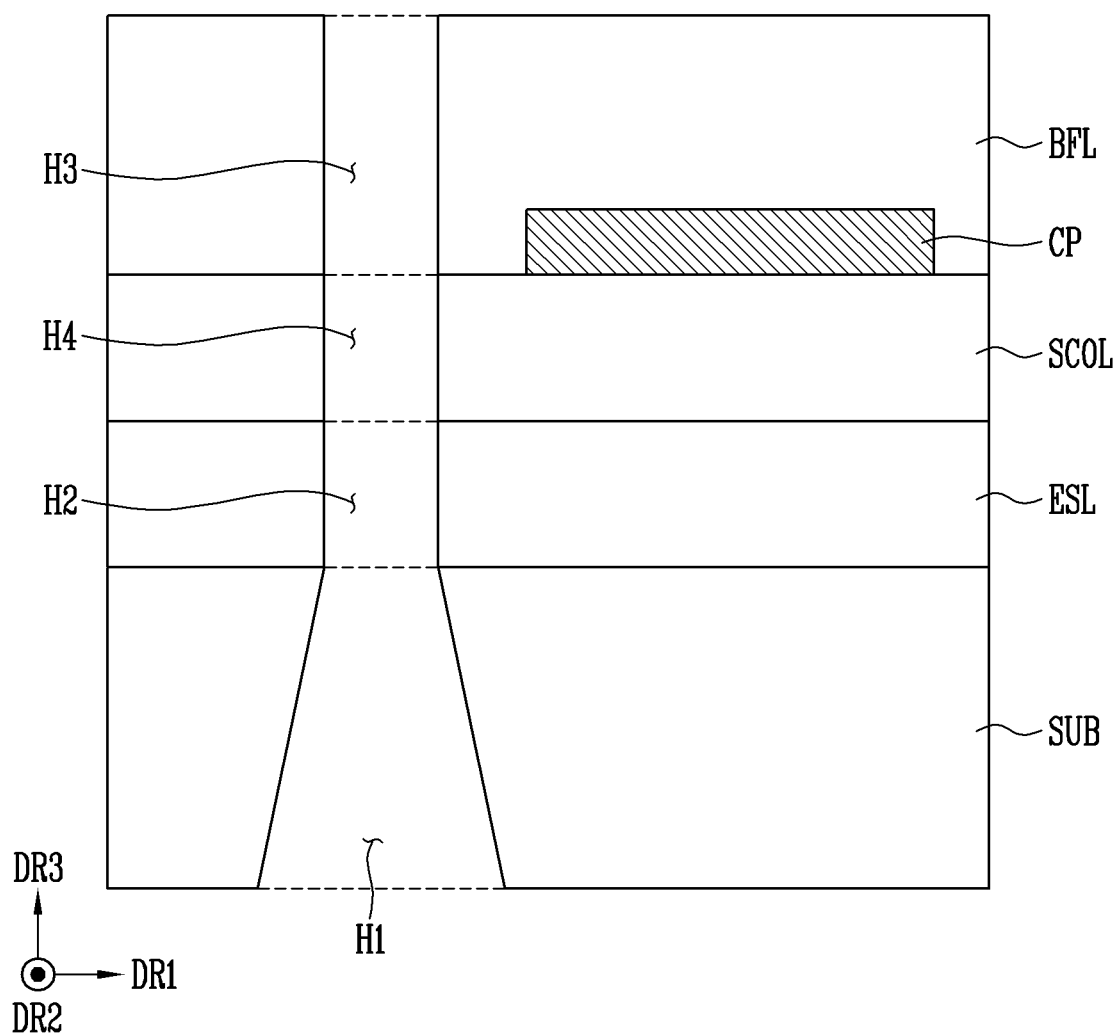
FIG. 14 is a schematic cross-sectional view illustrating a display device in accordance with an embodiment.

FIG. 14 is a schematic cross-sectional view illustrating a display device in accordance with an embodiment.

Referring to FIG. 13, a manufacturing method of a display device in accordance with a modification may include a step of irradiating a laser light onto a substrate to form a hole line (S310), a step of depositing an etch stopper layer on the substrate (S320), a step of locating or depositing a stress compensation layer on the etch stopper layer (S330), a step of forming a conductive pattern on the etch stopper layer (S340), a step of locating or depositing a buffer layer on the stress compensation layer to cover or overlap the conductive pattern (S350), a step of etching the substrate to form a first hole (S360), a step of forming a second hole in the etch stopper layer (S370), a step of forming a third hole in the buffer layer (S380), a step of forming a fourth hole in the stress compensation layer (S390), and a step of disposing a display element layer including a light emitting element (S395).

Similar to the description with reference to FIG. 11, in the laser light irradiating step (S310), a predetermined hole line may be formed on a substrate SUB. In the etch stopper layer depositing step (S320), an etch stopper layer ESL may be deposited on the substrate SUB through a predetermined process (for example, a chemical vapor deposition (CVD) process).

The stress compensation layer locating or depositing step (S330), a stress compensation layer (see 'SCOL' shown in FIG. 14) may be provided or disposed on the etch stopper layer ESL.

The stress compensation layer SCOL may be provided through the 'CVD process', identically to the deposition process performed on the etch stopper layer ESL. For example, the process on the stress compensation layer SCOL may be performed continuously to the process of forming the etch stopper layer ESL.

The stress compensation layer SCOL may distribute stress which may occur in the display device 1. A direction of stress occurring in a case that an external force may be applied to the stress compensation layer SCOL may be different from that of stress occurring in a case that the external force may be applied to an adjacent layer.

In a case that the thickness of the display device 1 is increased as individual components may be stacked on the substrate SUB, the substrate SUB may be curved. However, stress occurring in a case that the stress compensation layer SCOL may be provided may be distributed, so that a phenomenon in which the substrate SUB may be curved may be prevented.

In the conductive pattern forming step (S340), a conductive pattern CP may be provided or disposed on the stress compensation layer SCOL. In this step, the conductive pattern CP may be formed on the stress compensation layer SCOL through a sputtering process. Alternatively, although not shown in the drawing, the conductive pattern CP may be provided or disposed in a partial area of the etch stopper layer ESL on which the stress compensation layer SCOL may not be located or disposed through the sputtering process.

In the buffer layer locating or depositing step (S350), a buffer layer BFL may be provided through the CVD process. The buffer layer BFL may be formed on the stress compensation layer SCOL to at least cover or overlap the conductive pattern CP.

Referring to FIG. 14, in the substrate etching step (S360), a first hole H1 may be formed by removing at least a portion of the substrate SUB. In the second hole forming step (S370), a second hole H2 fluidically connected to the first hole H1 may be formed by removing at least a portion of the etch stopper layer ESL. In the third hole forming step (S380), a third hole H3 may be provided by removing at least a portion of the buffer layer BFL. In the fourth hole forming step (S390), a fourth hole H4 fluidically connected to the second hole H2 and the third hole H3 may be provided by removing at least a portion of the stress compensation layer SCOL. In the display element layer disposing step (S395), a light emitting element LD may be provided, which may output light in a case that an electrical signal may be applied. Consequently, the first hole H1, the second hole H2, the third hole H3, and the fourth hole H4 may be provided or formed as a single cavity or aperture toward a thickness direction of the substrate SUB (see the "third direction DR3").

In accordance with the disclosure, there may be provided a display device and a manufacturing method thereof, in which an etch stopper layer included in the display device at least may include amorphous carbon and may be formed through a chemical vapor deposition (CVD) process, so that a manufacturing process may be simplified and any additional process may not be required.

Although embodiments are described for illustrative purposes, it will be apparent to those skilled in the art that various modifications and changes may be made thereto within the scope of the disclosure without departing from the essential features of the disclosure. Therefore, advantageous embodiments may be implemented individually or in combination.

Accordingly, the above-described embodiments should be construed not to limit the technical spirit but to be provided for illustrative purposes so that those skilled in the art can fully understand the spirit of the disclosure. The scope of the disclosure should not be limited to the aforementioned embodiments but defined by the appended claims. The technical spirit within the scope substantially identical with the scope of the disclosure will be considered to fall within the scope of the disclosure defined by the appended claims.

What is claimed is:

1. A method of manufacturing a display device, the method comprising:
    irradiating a laser light onto a substrate to form a hole line in the substrate;
    forming an etch stopper layer on the substrate to overlap the hole line, the etch stopper layer including amorphous carbon;
    forming a buffer layer on the etch stopper layer;
    etching the substrate to form a first hole corresponding to the hole line;
    forming a second hole corresponding to the first hole in the etch stopper layer;
    forming a third hole corresponding to the second hole in the buffer layer; and
    disposing a display element layer including a light emitting element that emits light in response to an electrical signal provided to the light emitting element.

2. The method of claim 1, wherein the forming of the first hole, the second hole, and third hole includes forming the first hole, the second hole, and the third hole as a single cavity.

3. The method of claim 1, wherein the etching of the substrate includes forming the first hole through a wet etching process.

4. The method of claim 1, wherein the forming of the second hole includes removing the etch stopper layer corresponding to the second hole through an O2 ashing process.

5. The method of claim 1, wherein the forming of the second hole and the forming of the third hole are performed in a single process.

6. The method of claim 1, wherein the forming of the etch stopper layer and the forming of the buffer layer are continuously performed.

7. The method of claim 1, wherein the forming of the hole line includes forming the hole line in a thickness direction of the substrate.

8. The method of claim 1, further comprising:
    forming a conductive pattern on the etch stopper layer between the forming of the etch stopper layer and the forming of the buffer layer.

9. The method of claim 8, further comprising:
    forming a stress compensation layer on the etch stopper layer between the forming of the conductive pattern on the etch stopper layer and the forming of the buffer layer.

* * * * *